United States Patent
Kawai

(10) Patent No.: US 10,647,510 B2
(45) Date of Patent: May 12, 2020

(54) BOARD WORK MACHINE AND BOARD WORK SYSTEM

(71) Applicant: FUJI CORPORATION, Chiryu-shi (JP)

(72) Inventor: Hidetoshi Kawai, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 191 days.

(21) Appl. No.: 15/743,446

(22) PCT Filed: Jul. 15, 2015

(86) PCT No.: PCT/JP2015/070259
§ 371 (c)(1),
(2) Date: Jan. 10, 2018

(87) PCT Pub. No.: WO2017/009967
PCT Pub. Date: Jan. 19, 2017

(65) Prior Publication Data
US 2018/0201446 A1 Jul. 19, 2018

(51) Int. Cl.
*B65G 15/44* (2006.01)
*B65G 43/00* (2006.01)
*H05K 13/00* (2006.01)

(52) U.S. Cl.
CPC ............. *B65G 15/44* (2013.01); *B65G 43/00* (2013.01); *H05K 13/0061* (2013.01);
(Continued)

(58) Field of Classification Search
CPC . B23Q 7/00; B23Q 7/001; B23Q 7/03; B23Q 7/1447; B23Q 7/1452;
(Continued)

(56) References Cited

U.S. PATENT DOCUMENTS 3,513,963 A * 5/1970 Witte ..................... B65G 15/42
198/803.8
3,727,747 A * 4/1973 Damm ............... H05K 13/0061
198/747

(Continued)

FOREIGN PATENT DOCUMENTS

| JP | 5-39124 A | 2/1993 |
| WO | WO2014/188513 A1 | 11/2014 |
| WO | WO-2014188513 A1 * | 11/2014 |

OTHER PUBLICATIONS

Extended European Search Report dated Jun. 11, 2018 in European Patent Application No. 15898279.3, 8 pages.
(Continued)

*Primary Examiner* — Tyrone V Hall, Jr.
(74) *Attorney, Agent, or Firm* — Oblon, McClelland, Maier & Neustadt, L.L.P.

(57) ABSTRACT

A work machine including a conveyor belt is rotated such that a protruding section is positioned on the upstream side of an end face on the opposite side to a conveyance direction of a circuit board while the circuit board is clamped by a clamping device. Thereby, it is possible to prevent interference between the projecting portion and the circuit board, and reliably push out the circuit board toward the downstream side using the protruding section. In multiple work machines, the circuit boards are simultaneously conveyed after a clamp of the circuit board is released. Thereby, there is no need for the work machine on the upstream side to be on standby for conveyance of the circuit board using the work machine on the downstream side and it is possible to prevent a reduction of throughput.

4 Claims, 9 Drawing Sheets

(52) U.S. Cl.
CPC ............... *B65G 2203/0233* (2013.01); *B65G 2203/0266* (2013.01); *B65G 2203/044* (2013.01); *B65G 2811/0673* (2013.01)

(58) Field of Classification Search
CPC ........ B23Q 7/1468; B23Q 7/16; B65G 15/28; B65G 15/42; B65G 43/08; H05K 13/0061
See application file for complete search history.

(56) References Cited

U.S. PATENT DOCUMENTS

| | | | | |
|---|---|---|---|---|
| 4,436,806 A * | 3/1984 | Rendulic | ............... | G03F 7/0275 430/281.1 |
| 4,591,044 A * | 5/1986 | Ogami | ............... | B23Q 7/006 198/346.3 |
| 4,649,635 A * | 3/1987 | Asai | ............... | H05K 13/0061 29/741 |
| 4,723,652 A * | 2/1988 | Rich | ............... | B65G 15/42 198/484.1 |
| 4,928,806 A * | 5/1990 | Anderson | ............... | B23Q 7/005 198/345.1 |
| 4,947,980 A * | 8/1990 | Helmstetter | ............... | B23Q 7/1447 198/345.3 |
| 5,094,584 A * | 3/1992 | Bullock | ............... | H05K 13/0061 324/757.02 |
| 5,115,905 A * | 5/1992 | Hollinger, II | ............... | B65G 17/46 198/465.1 |
| 5,233,745 A * | 8/1993 | Morita | ............... | H05K 13/0812 29/705 |
| 5,322,154 A * | 6/1994 | Lenherr | ............... | B65G 21/14 198/460.2 |
| 6,256,869 B1 * | 7/2001 | Asai | ............... | H05K 13/0061 198/468.01 |
| 6,321,904 B1 * | 11/2001 | Mitchell | ............... | B65G 15/42 198/690.2 |
| 6,769,534 B2 * | 8/2004 | Lee | ............... | H05K 13/0061 198/817 |
| 8,649,894 B2 * | 2/2014 | Hattori | ............... | H05K 13/0015 29/739 |
| 2002/0178754 A1 * | 12/2002 | Richter | ............... | B65G 15/42 65/111 |
| 2006/0172569 A1 * | 8/2006 | Shiang | ............... | H05K 13/0061 439/83 |
| 2007/0179002 A1 * | 8/2007 | DeGroot | ............... | B65G 15/42 474/205 |
| 2007/0238565 A1 * | 10/2007 | Marler | ............... | A01D 43/077 474/237 |
| 2010/0326797 A1 * | 12/2010 | Borden | ............... | B65G 15/42 198/793 |
| 2013/0341156 A1 * | 12/2013 | Vogeley, Jr. | ............... | B26D 5/007 198/340 |

OTHER PUBLICATIONS

Iniernabonal Search Report dated Oct. 20, 2015, in PCT/JP2015/070259, filed Jul. 15, 2015.

* cited by examiner

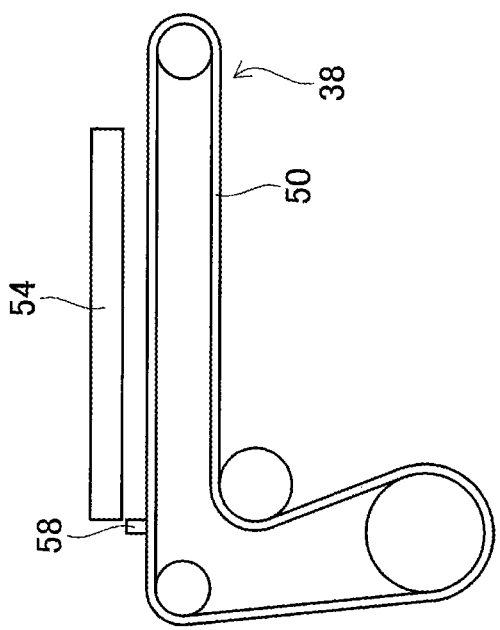
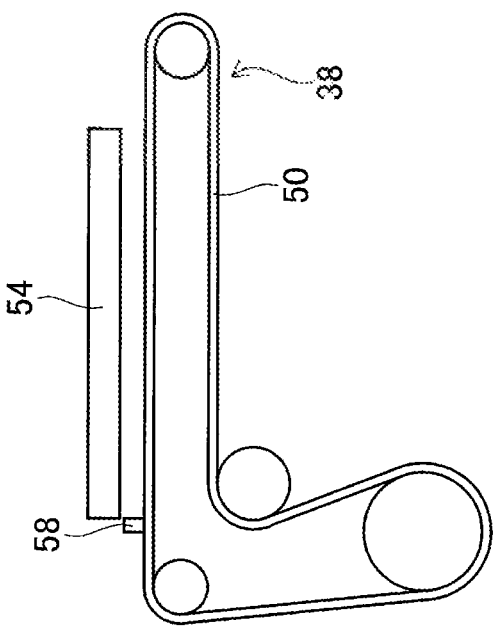
FIG. 7

BOARD WORK MACHINE AND BOARD WORK SYSTEM

TECHNICAL FIELD

The present application relates to a board work machine that performs work on a circuit board, and a board work system that is provided with multiple board work machines arranged in one row.

BACKGROUND ART

Ordinarily, a board work machine is provided with a conveyance device for conveying a circuit board, and the conveyance device has a conveyor belt. Then, the circuit board is placed on the conveyor belt, and the circuit board is conveyed toward the downstream side by the conveyor belt being rotated. As described in the patent literature below, a protruding section is formed on a placement face of a circuit board on a conveyor belt, and the circuit board is reliably pushed out toward the downstream side by the protruding section.

PTL 1: JP-A-05-039124

SUMMARY

Technical Problem

According to the board work machine described in the patent literature described above, it is possible to reliably push out the circuit board toward the downstream side. However, there is a concern that the circuit board rides up on the protruding section that is formed on the placement face of the conveyor belt, but in the patent literature described above, there is considered not to be such a concern. In addition, in a board work system that is provided with multiple board work machines arranged in one row, in each work machine, the circuit board is sequentially conveyed toward the work machine on the downstream side. At this time, to avoid interference between circuit boards, in the system in the related art, the work machine on the downstream side conveys the circuit board, then the work machine on the upstream side conveys the circuit board toward the work machine on the downstream side. However, in this manner, there is a concern that throughput is reduced by the work machine on the upstream side standing by for conveyance of the circuit board by the work machine on the downstream side. In this manner, it is considered that there is a lot of room for improvement in the board work machine that is provided with a conveyance device and practicality of the board work machine is improved by making various improvements. The present disclosure is carried out in light of actual circumstances and has the object of providing a board work machine and a board work system with high practicality.

Solution to Problem

In order to solve the problem described above, a board work machine of the present disclosure is provided with a conveyance device that has a conveyor belt on which a circuit board is placed and a clamping device that clamps the circuit board in a state in which the circuit board has been moved on the conveyor belt, and a control device that controls operation of the conveyance device, wherein a protruding section is formed on a placement face of the conveyor belt, and the control device has a rotation control section that rotates the conveyor belt such that the protruding section is positioned on the upstream side of an end face on an opposite side to a conveyance direction of the circuit board in a case where the clamp is released, while the circuit board is clamped by the clamping device.

In order to solve the problem described above, a board work system of the present disclosure is provided with a plurality of the board work machines arranged in one row and executes work on the circuit board that is conveyed from a board work machine disposed on the upstream side of the plurality of board work machines to the board work machine disposed on the downstream side, wherein the control device has a conveyance control section that simultaneously conveys the circuit boards after the clamping of the circuit boards is released in two or more adjacent board work machines out of the plurality of board work machines.

Advantageous Effects

In the board work machine of the present disclosure, a conveyor belt is rotated such that a protruding section is positioned on the upstream side of an end face on an opposite side to a conveyance direction of a circuit board while the circuit board is clamped by a clamping device. Thereby, it is possible to prevent the circuit board from riding up on the protruding section and reliably push out the circuit board toward the downstream side using the protruding section. In addition, in the board work system of the present disclosure, in multiple adjacent board work machines, the circuit boards are simultaneously conveyed after clamps of the circuit boards are released. Thereby, there is no need for the work machine on the upstream side to be on standby for conveyance of the circuit board using the work machine on the downstream side and it is possible to prevent a reduction of throughput.

BRIEF DESCRIPTION OF DRAWINGS

FIG. 7 is an operational view of the conveyance device when the circuit board is conveyed.

DESCRIPTION OF EMBODIMENTS

Hereinafter, detailed description will be given of the applied example of the present disclosure with reference to the drawings as a mode for carrying out the present disclosure.

<Configuration of Board Work System>

Figure 1:
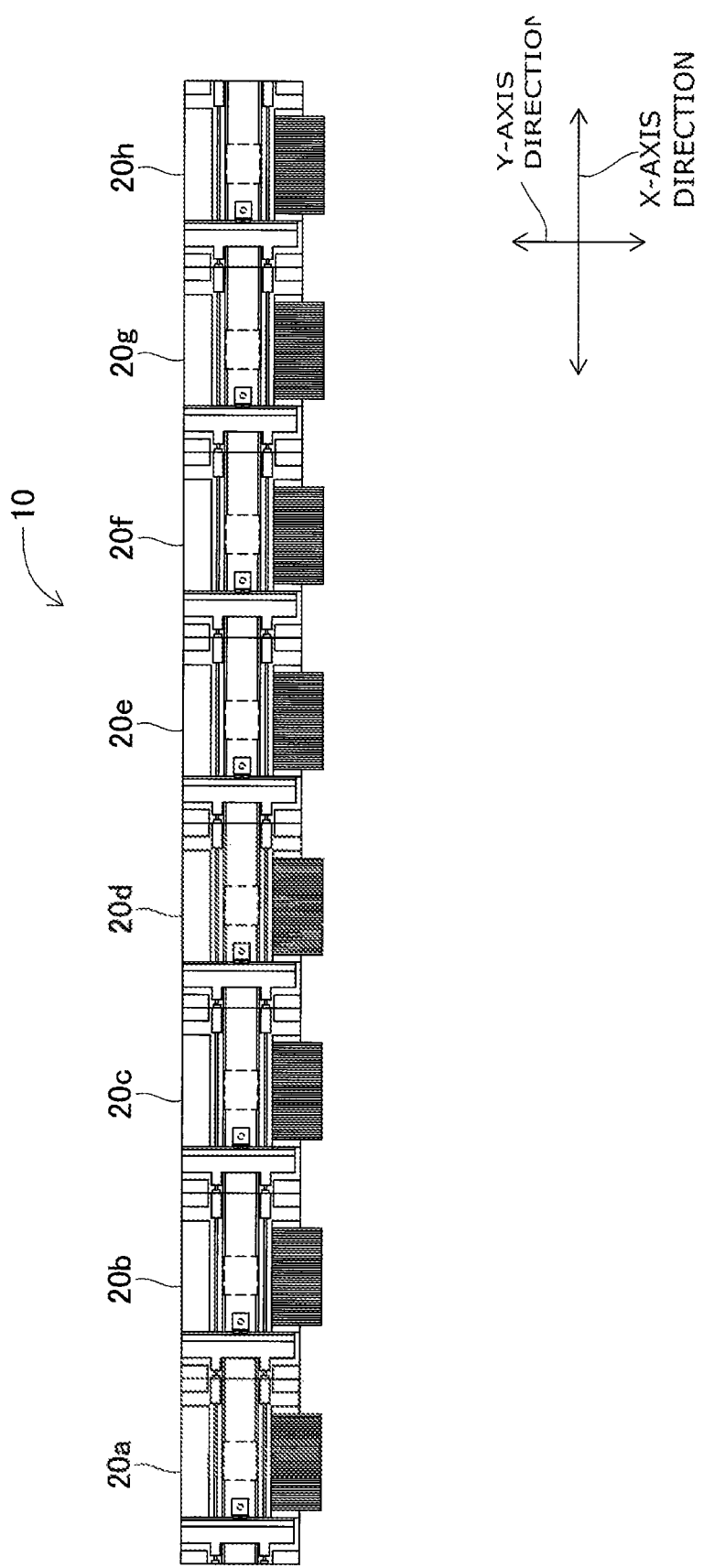
FIG. 1 is a plan view illustrating a board work system.

FIG. 1 illustrates a board work system 10. The board work system 10 is a system for mounting electronic components on a circuit board. The board work system 10 is configured by eight work machines 20. The eight work machines 20 are lined up in one row and are disposed in an adjacent state. Note that, in the following description, a direction in which the work machines 20 are lined up will be referred to as an X-axis direction, and a horizontal direction which is at a right angle to the X-axis direction will be referred to as a Y-axis direction. In addition, in a case where the eight work machines 20 are distinguished, work machines 20a to 20h may be described.

Figure 2:
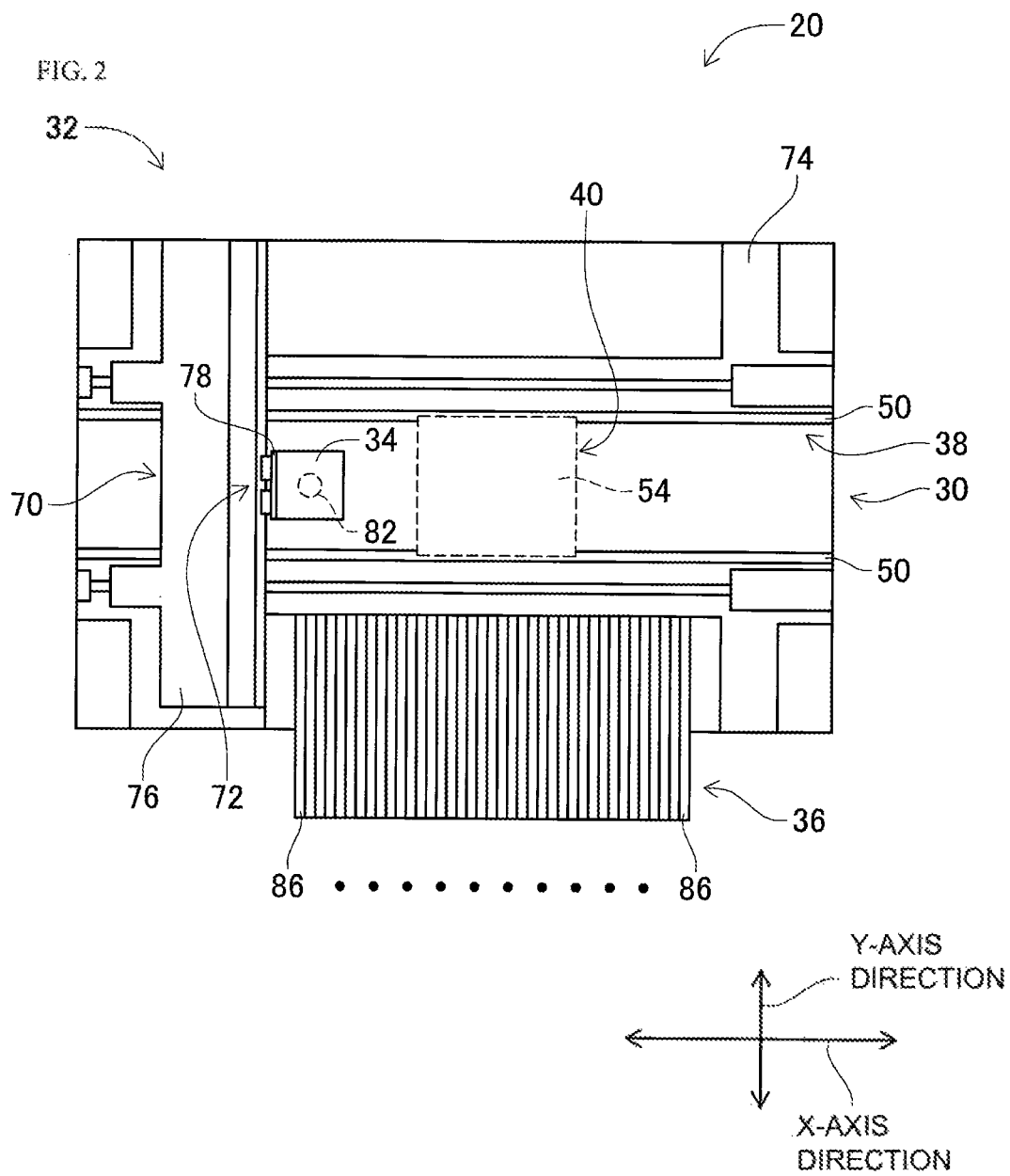
FIG. 2 is a plan view illustrating a work machine.

As shown in FIG. 2, the work machine 20 is provided with a conveyance device 30, a mounting head moving device (hereinafter may be abbreviated to "moving device") 32, a mounting head 34, and a supply device 36.

Figure 3:
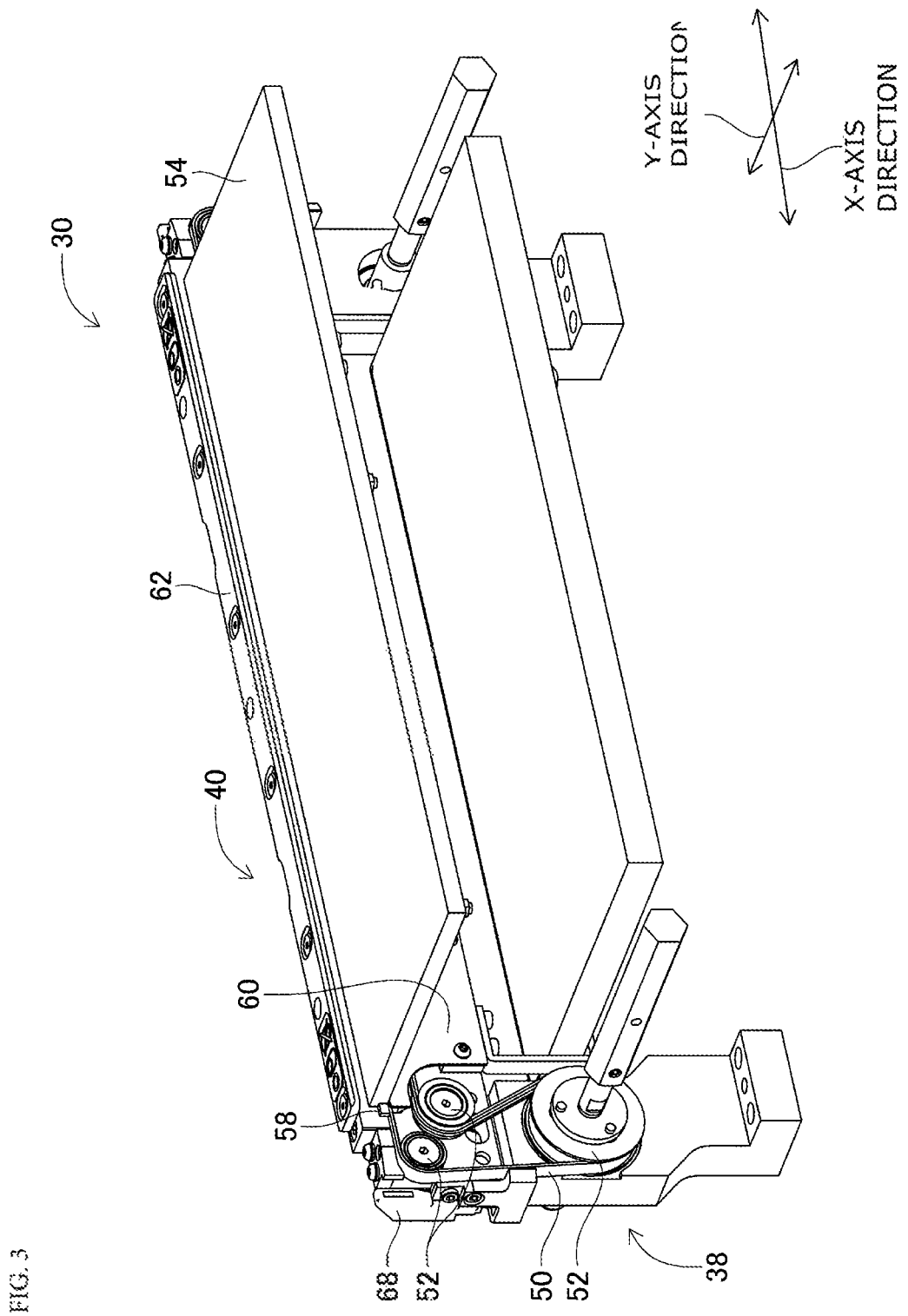
FIG. 3 is a perspective view illustrating a conveyance device.

The conveyance device 30 has a conveyor device 38 and a board holding device 40. The conveyor device 38 has one pair of conveyor belts 50 and multiple pulleys (refer to FIG. 3) 52. As shown in FIG. 3, each conveyor belt 50 is wound around multiple pulleys 52, and is disposed so as to extend in the X-axis direction. Then, the circuit board 54 is supported by the one pair of conveyor belts 50. Note that, FIG. 3 illustrates only one out of the one pair of conveyor belts 50. In addition, the conveyor belt 50 circulates by rotation of one pulley out of the multiple pulleys 52 by driving of an electromagnetic motor (refer to FIG. 5). Thereby, the circuit board 54 that is supported by the one pair of conveyor belts 50 is conveyed in the X-axis direction. Note that, the conveyance direction of the circuit board 54 is a direction from left to right in the diagram, and a revolving direction of the conveyor belt 50 when the circuit board 54 is conveyed in the conveyance direction is indicated as a forward direction. In addition, a plate-shape protruding section 58 is formed on a support surface on a side on which the circuit board 54 is supported of the conveyor belt 50.

In addition, the board holding device 40 has one pair of lifting and lowering plates (only one lifting and lowering plate is illustrated in FIG. 3) 60 and one pair of locking plates (only one locking plate is illustrated in FIG. 3) 62. The one pair of lifting and lowering plates 60 is disposed to correspond to the one pair of conveyor belts 50. Each lifting and lowering plate 60 is disposed so as to extend in the X-axis direction in an erect state inside the corresponding conveyor belt 50. In addition, each lifting and lowering plate 60 is able to slide in the up-down direction below the circuit board 54 that is supported on the one pair of conveyor belts 50. Then, each lifting and lowering plate 60 slides in the up-down direction by driving of the electromagnetic motor (refer to FIG. 5) 66. Thereby, when the one pair of lifting and lowering plates 60 is lifted, the lifting and lowering plate 60 is slid above the conveyor belt 50, and the circuit board 54 is lifted above the conveyor belt 50 by the lifting and lowering plate 60. Meanwhile, when the one pair of lifting and lowering plates 60 is lowered, each lifting and lowering plate 60 is slid below each conveyor belt 50, and the circuit board 54 is supported by the conveyor belt 50.

Figure 4:
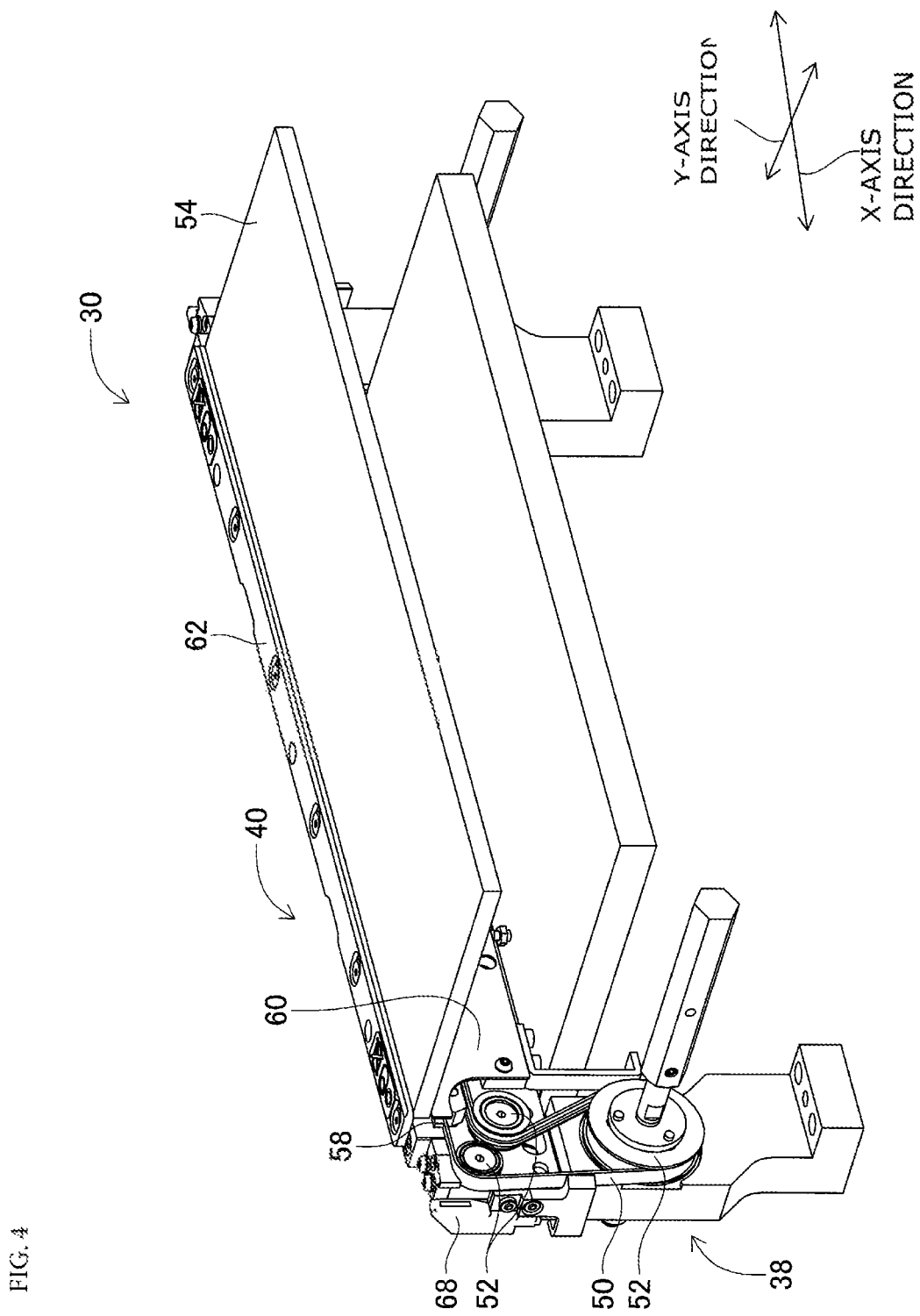
FIG. 4 is a perspective view illustrating a conveyance device.

In addition, the one pair of locking plates 62 is disposed to correspond to the one pair of conveyor belts 50. Each locking plate 62 is disposed so as to extend above the corresponding conveyor belt 50. Then, as shown in FIG. 4, the circuit board 54 that is supported by the conveyor belt 50 is lifted upward by the lifting and lowering plate 60, thereby the circuit board 54 is supported by the lifting and lowering plate 60 and the locking plate 62. By such a structure, the circuit board 54 is clamped by the board holding device 40, and mounting work is performed on the circuit board 54 at a position that is clamped by the board holding device 40. Then, when the mounting work on the circuit board 54 is completed, the lifting and lowering plate 60 is lowered and the clamping of the circuit board 54 by the board holding device 40 is released. Note that, the lifting amount of the circuit board 54 that is lifted up by lifting of the lifting and lowering plate 60 from the conveyor belt 50 is longer than the height dimension of the protruding section 58 of the conveyor belt 50. Thereby, when the circuit board 54 is clamped by the board holding device 40, it is possible to rotate the conveyor belt 50 without interference between the circuit board 54 and the protruding section 58.

Furthermore, the conveyance device 30 has a detection sensor 68. The detection sensor 68 is disposed on the most upstream side out of the conveyance range of the circuit board 54 that is conveyed by the conveyor device 38, and detects the circuit board 54 at a timing at which the circuit board 54 is brought inside the work machine 20. Then, the circuit board 54 is conveyed to a clamping position by the board holding device 40 by rotating the conveyor belt 50 at a predetermined amount after the circuit board 54 is detected by the detection sensor 68.

As shown in FIG. 2, the moving device 32 is configured by an X-axis direction slide mechanism 70 and a Y-axis direction slide mechanism 72. The X-axis direction slide mechanism 70 has an X-axis slider 76 that is provided on a base 74 to be able to move in the X-axis direction. The X-axis slider 76 moves to an arbitrary position in the X-axis direction through driving of the electromagnetic motor (refer to FIG. 5) 77. In addition, the Y-axis direction slide mechanism 72 has a Y-axis slider 78 that is provided on a side face of the X-axis slider 76 to be able to move in the Y-axis direction. The Y-axis slider 78 moves to an arbitrary position in the Y-axis direction through driving of the electromagnetic motor (refer to FIG. 5) 80. The mounting head 34 is attached to the Y-axis slider 78. By such a structure, the mounting head 34 is moved to an arbitrary position on the base 74 by the moving device 32.

The mounting head 34 mounts an electronic component on the circuit board 54. The mounting head 34 has a suction nozzle 82 that is provided on the lower end face. The suction nozzle 82 communicates with the positive and negative pressure supply device (refer to FIG. 5) 84 via a negative pressure air and positive pressure air passage. The suction nozzle 82 sucks and holds the electronic component by negative pressure and detaches the held electronic component by positive pressure.

The supply device 36 is a feeder-type supply device, and has multiple tape feeders 86. The tape feeder 86 accommodates the taped component in a wound state. The taped components are parts in which the electronic component is taped. Then, the tape feeder 86 feeds out taped component using the feed device (refer to FIG. 5) 88. Thereby, the feeder-type supply device 36 supplies the electronic component to a supply position by feeding out the taped component.

In addition, the work machine 20 is provided with a mark camera (refer to FIG. 5) 96 and a parts camera (refer to FIG. 5) 98. The mark camera 96 is disposed in a state of facing downward at the lower face side of the Y-axis slider 78 of the moving device 32. Thereby, the mark camera 96 images an arbitrary position of the base 74. The parts camera 98 is disposed in a state of facing upward between the conveyance device 30 and the supply device 36. Thereby, the parts camera 98 images the electronic component which is held by the suction nozzle 82.

Figure 5:
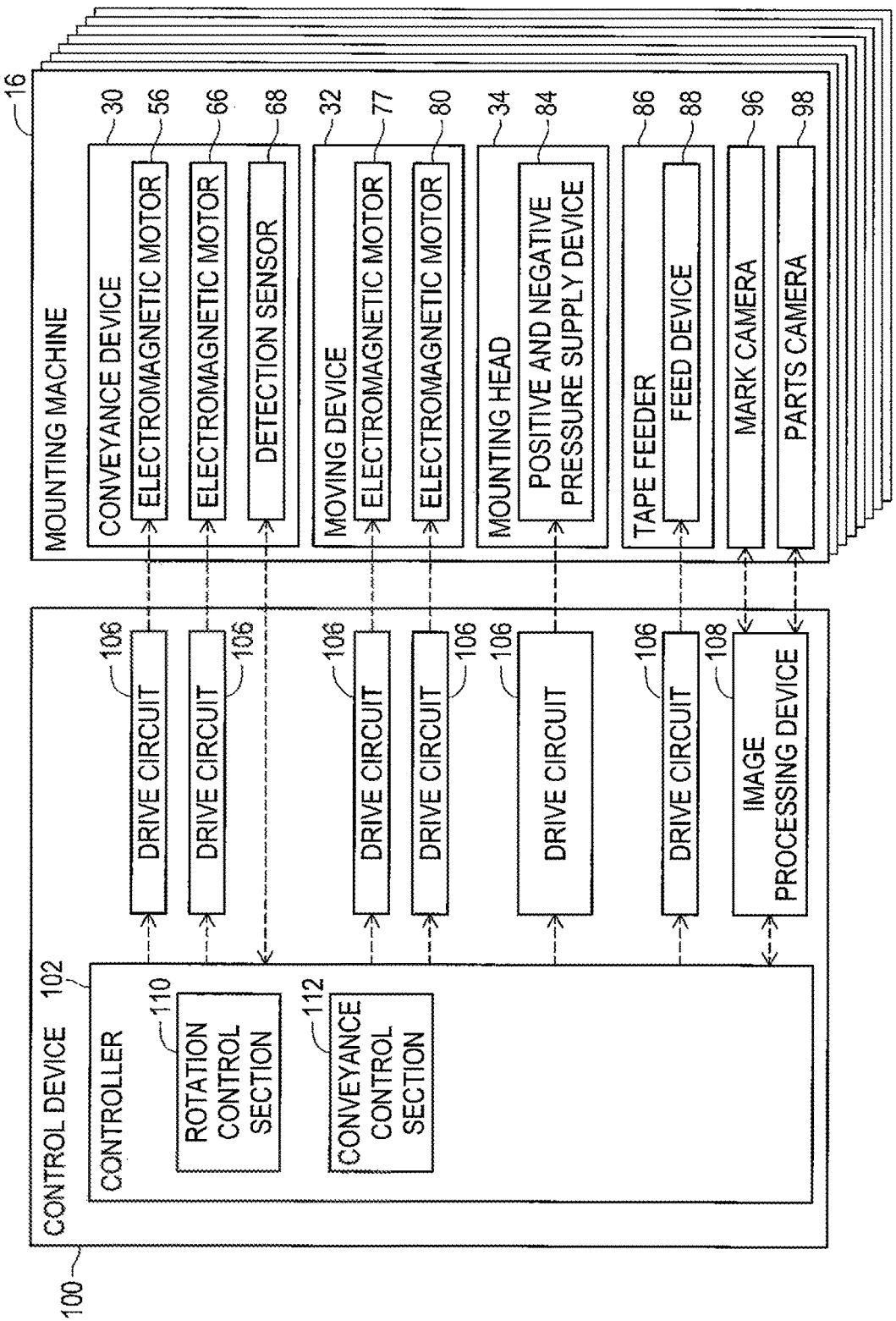
FIG. 5 is a block diagram illustrating a control device.

As shown in FIG. 5, furthermore, the work machine 20 is provided with a control device 100. The control device 100 is provided with a controller 102, multiple drive circuits 106, and an image processing device 108. The multiple drive circuits 106 are connected to electromagnetic motors 56, 66, 77, and 80, the positive and negative pressure supply device 84, and the feed device 88. The controller 102 is provided with a CPU, a ROM, a RAM, and the like, is a main constituent of a computer, and is connected to the multiple drive circuits 106. Thereby, the operation of the conveyance device 30, the moving device 32, and the like are controlled by the controller 102. In addition, the controller 102 is also connected to the image processing device 108. The image processing device 108 is a device for processing captured image data that is imaged by the mark camera 96 and the parts camera 98. Thereby, the controller 102 acquires data that is obtained from the captured image data. Furthermore, the controller 102 is connected to the detection sensor 68, and acquires the value detected by the detection sensor 68.

<Mounting Work by Board Work System>

In the board work system 10, mounting work of the electronic component on the circuit board 54 is performed using the configuration described above. Specifically, first, the circuit board 54 is brought inside the work machine 20a that is positioned on the most upstream side. Then, the circuit board 54 is conveyed to a clamping position by the conveyor device 38 of the work machine 20a, and is held at the position by the board holding device 40 in a fixed manner. Next, the mark camera 96 moves above the circuit board 54 and images the circuit board 54. Thereby, information relating to the holding position and the like of the circuit board 54 is obtained. In addition, the tape feeder 86 feeds out the taped component and supplies the electronic component to a supply position. Then, the mounting head 34 moves above the supply position of the electronic component and sucks and holds the electronic component using the suction nozzle 82.

Next, the mounting head 34 moves above the parts camera 98, and the electronic component which is held by the suction nozzle 82 is imaged by the parts camera 98. Thereby, information relating to the holding posture and the like of the component is obtained. Then, the mounting head 34 moves above the circuit board 54, corrects the holding position of the circuit board 54, the holding posture of the electronic component, and the like, and mounts the held electronic component onto the circuit board 54. When the mounting work of the electronic component by the work machine 20a is completed, the clamping of the circuit board 54 by the board holding device 40 is released, and the circuit board 54 is conveyed to the work machine 20b on the downstream side. Then, the work machine 20b executes the same work as the above-mentioned mounting work. Note that, when the circuit board 54 on which the mounting work from the work machine 20a is completed is conveyed to the work machine 20b, a new circuit board 54 is brought inside the work machine 20a. By doing so, the circuit board 54 on which the mounting work is completed by each work machine 20 is sequentially conveyed to the work machine 20 on the downstream side, and when the mounting work is completed by all work machines 20, the circuit board 54 is discharged from a work machine 20h on the most downstream side of the board work system 10.

<Conveyance of Circuit Board by Conveyance Device>

As described above, in the board work system 10, the circuit board 54 on which the mounting work is completed by each work machine 20 is sequentially conveyed to the work machine 20 on the downstream side, and thereby executes mounting work on the circuit board. However, in a state in which the circuit board 54 is not discharged from the work machine 20 on the downstream side, when the circuit board is conveyed to the work machine 20 on the downstream side by the work machine 20 on the upstream side, there is a concern that the circuit boards interfere with each other. Therefore, in a method of the related art, the circuit board 54 is discharged from the work machine 20 on the downstream side, then the work machine 20 on the upstream side conveys the circuit board to the work machine 20 on the downstream side. However, in the method of the related art, it is necessary for the work machine 20 on the upstream side to put discharge of the circuit board 54 by the work machine 20 on the downstream side on stand by, and there is a concern that throughput is reduced.

Figure 6:
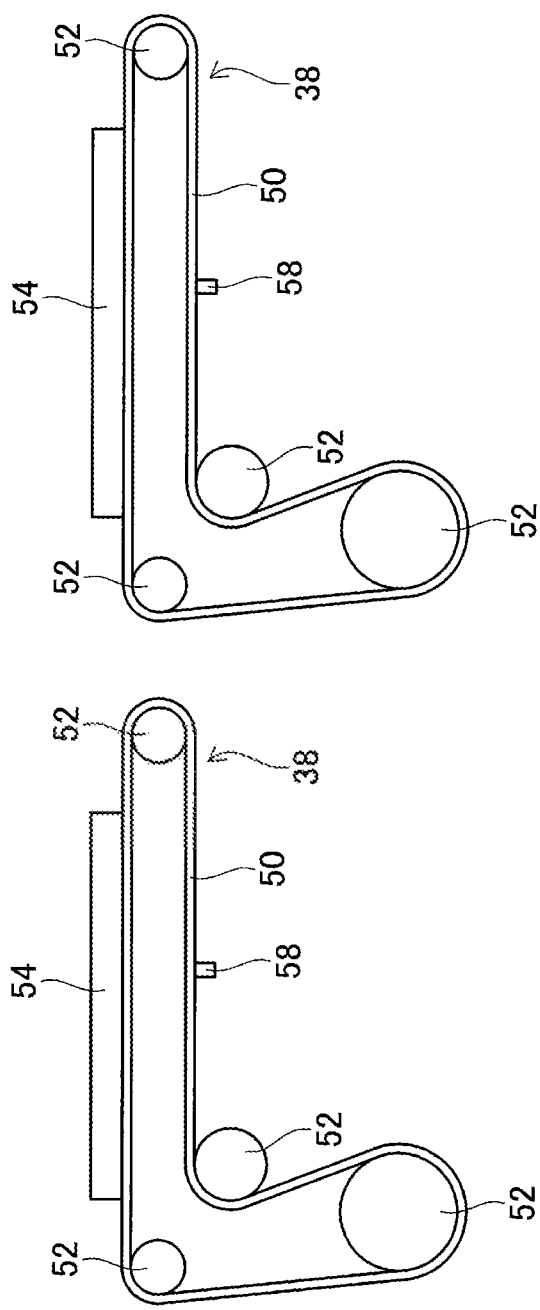
FIG. 6 is an operational view of the conveyance device when the circuit board is conveyed.

In consideration of such, in the board work system 10, the circuit board 54 is pushed out toward the work machine 20 on the downstream side by the protruding section 58 of the conveyor belt 50, and conveyance of the circuit boards 54 is simultaneously performed in the multiple work machines 20. Specifically, as shown in FIG. 6, in each work machine 20, the circuit board 54 is conveyed to the working position by the conveyor device 38. Next, in each work machine 20, the circuit board 54 is lifted upward by the board holding device 40, and thereby clamped and the mounting work is executed on the circuit board 54. Then, the conveyor belt 50 is caused to orbit in the forward direction by the operation of the conveyor device 38 while the mounting work is executed on the circuit board 54. At this time, as shown in FIG. 7, the conveyor belt 50 is caused to orbit such that an end face on the opposite side to the conveyance direction of the circuit board 54 and an end face on the side of the revolving direction of the protruding section 58 match in the up-down direction. However, the conveyor belt 50 is caused to orbit such that it is possible to form a predetermined gap (clearance) between an end face on the opposite side to the conveyance direction of the circuit board 54 and an end face on the side of the revolving direction of the protruding section 58 in the up-down direction to prevent the circuit board 54 from riding up on the protruding section 58.

Note that, calibration of the position of the protruding section 58 is performed prior to mounting work to suitably match the end face on the opposite side to the conveyance direction of the circuit board 54 and the end face on the revolving direction side of the protruding section 58 in the up-down direction. In detail, prior to the mounting work, the conveyor belt 50 is orbited such that the protruding section 58 enters an imaging range of the mark camera 96 and the protruding section 58 is imaged by the mark camera 96. Next, the position of the protruding section 58 is calculated based on the captured image data. Then, calibration of the position of the protruding section 58 is performed based on the position of the calculated protruding section 58 and the rotation control position of the electromagnetic motor 56 that causes the conveyor belt 50 to orbit. Thereby, it is possible to suitably match the end face on the opposite side to the conveyance direction of the circuit board 54 and the end face on the revolving direction side of the protruding section 58 in the up-down direction.

Figure 8:
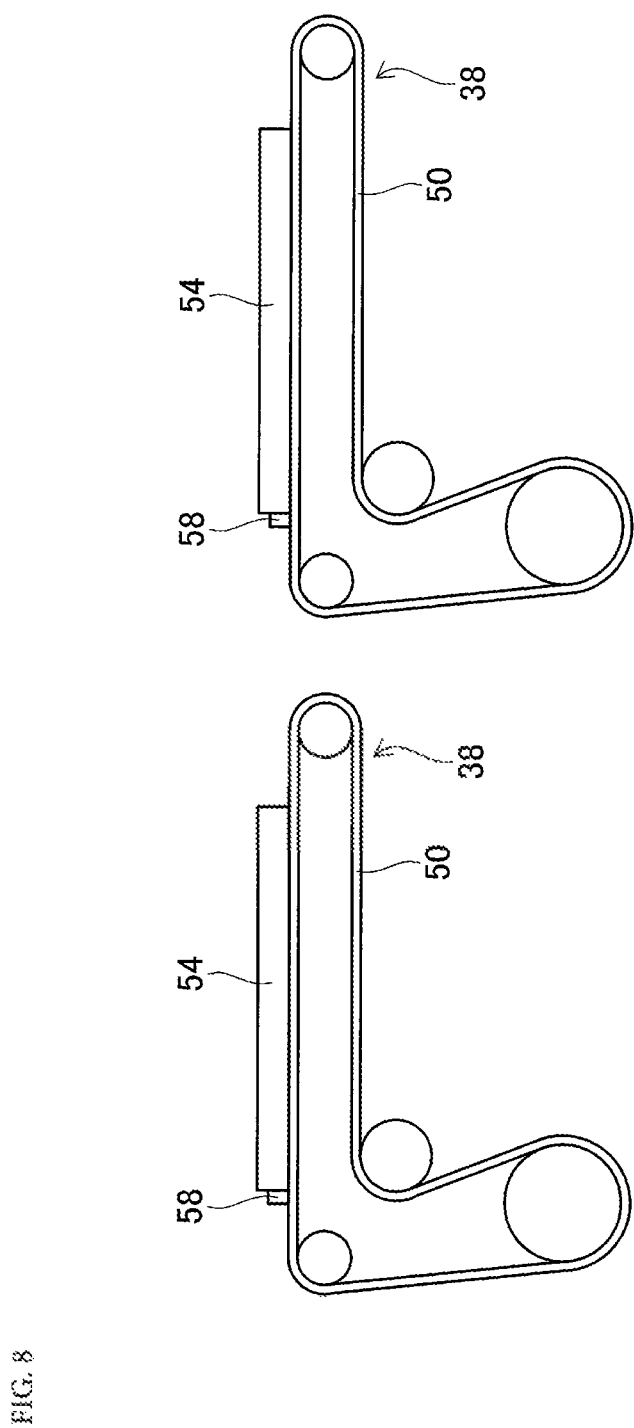
FIG. 8 is an operational view of the conveyance device when the circuit board is conveyed.
Figure 9:
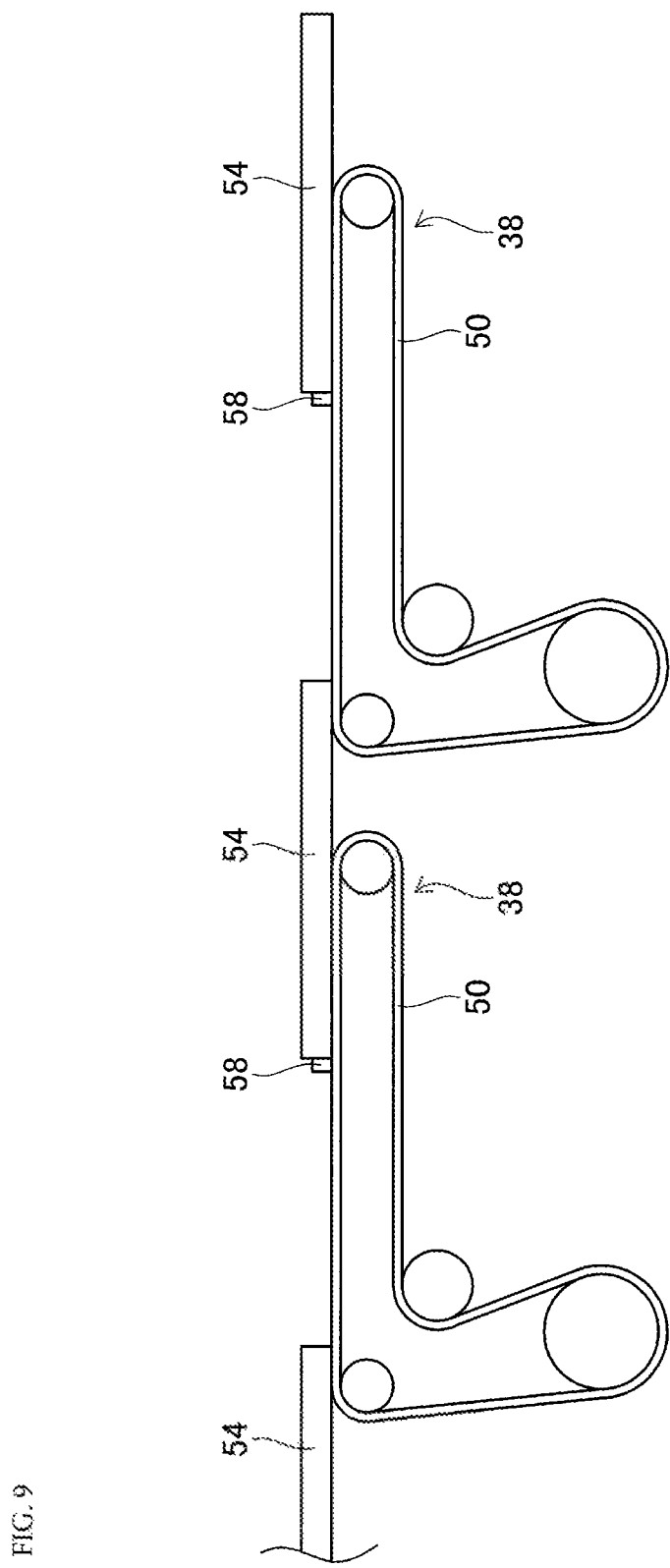
FIG. 9 is an operational view of the conveyance device when the circuit board is conveyed.

Then, in each work machine 20, when the mounting work on the circuit board 54 is completed, the clamping of the circuit board 54 for which the mounting work is completed is released. Thereby, the circuit board 54 is lowered and placed on the conveyor belt 50. At this time, as shown in FIG. 8, an end face on the opposite side to the conveyance direction of the circuit board 54 and an end face on the side of the revolving direction of the protruding section 58 engage. Then, in the multiple work machines 20, when clamping of the circuit board 54 is released, the conveyor device 38 simultaneously operates, and as shown in FIG. 9, multiple circuit boards 54 are simultaneously conveyed toward the work machine 20 on the downstream side. Thereby, in the manner of the method in the related art, there is no need for the work machine 20 on the upstream side to be on standby for discharge of the circuit board 54 by the work machine 20 on the downstream side and it is possible to prevent a reduction of throughput. In addition, the conveyed circuit board 54 is engaged with the protruding section 58, and therefore is able to reliably convey the circuit board 54 to the work machine 20 on the downstream side. Thereby, it is possible to reliably prevent interference of the circuit boards 54 with each other due to conveyance errors and the like of the circuit boards 54, and it is possible to suitably secure simultaneous conveyance of the circuit boards 54.

Note that, in the board work system 10, in all of the eight work machines 20, conveyance of the circuit board 54 is not simultaneously performed, the eight work machines 20 are divided into two groups, and the circuit boards 54 are simultaneously conveyed in each of the two groups. In detail, the eight work machines 20 are divided into a group of work machines 20 further on the downstream side than the work machine 20 with the longest mounting work time and a group of work machines 20 on the upstream side that includes the work machine 20 with the longest mounting work time. Then, in each group, in all of the work machines 20 of each group, mounting work is completed and clamping is released, then the circuit boards 54 are simultaneously conveyed.

Specifically, for example, in a case where the mounting work time is the longest in the work machine 20d out of the eight work machines 20, the eight work machines 20 are divided into two groups of a group of four adjacent work machines 20a to 20d and a group of four adjacent work machines 20e to 20h. Then, in the group of four work machines 20e to 20h, in all of the four work machines 20e to 20h, mounting work is completed and clamping is released, then the circuit boards 54 are simultaneously conveyed. In addition, in the group of four work machines 20a to 20d, in all of the four work machines 20a to 20d, mounting work is completed, then the circuit boards 54 are simultaneously conveyed. In this manner, it is not necessary to stand by for completion of the mounting work in the work machine 20d with the longest mounting work in the group of the four work machines 20e to 20h by simultaneously performing conveyance of the circuit boards 54 in each of the two groups. Thereby, it is possible to achieve further shortening of throughput.

In addition, for example, in the group of the four work machines 20e to 20h, in a case where the mounting work time of the work machine 20h on the most downstream side is shorter than the mounting work time of the other three work machines 20e to 20g, in the work machine 20h furthest on the downstream, the circuit board 54 may be conveyed after the mounting work is completed in the work machine 20h and clamping is released, and in the other three work machines 20e to 20g, the circuit board 54 may be conveyed after mounting work of all of the three work machines 20e to 20g is completed and clamping is released. In this manner, in the work machine 20h on the most downstream side, it is possible to achieve further shortening of throughput by immediately conveying the circuit board 54 by completing mounting work of the work machine 20h.

However, it may not be possible to shorten throughput according to the difference between the longest work time out of the group of the four work machines 20a to 20d and the longest work time out of the group of the four work machines 20e to 20h. Specifically, for example, with a longest work time of 60 seconds out of the group of four work machines 20a to 20d, the difference in work time of the two groups is 10 seconds in a case where the longest work time out of the group of the four work machines 20e to 20h is 50 seconds. In addition, it is assumed that the conveyance time of the circuit board 54 by the conveyance device 30 is 5 seconds. In such a case, when the circuit boards 54 are simultaneously conveyed in each of the two groups, it is necessary for the group of the four work machines 20e to 20h on the downstream side to stand by for 5 seconds that is the conveyance time of the circuit board 54. Meanwhile, when the circuit boards 54 are collectively and simultaneously conveyed in each of the eight work machines 20a to 20h, it is necessary for the group of the work machines 20e to 20h on the downstream side to stand by for 10 seconds that is a difference of work time between the two groups. That is, in a case where the difference of work time between the two groups is longer than the conveyance time of the circuit board 54 by the conveyance device 30, it is possible to achieve shortening of throughput by performing simultaneous conveyance of the circuit boards 54 in each of the two groups.

In addition, with a longest work time of 60 seconds out of the group of four work machines 20a to 20d, the difference in work time of the two groups is 4 seconds in a case where the longest work time out of the group of the four work machines 20e to 20h is 56 seconds. In addition, it is assumed that the conveyance time of the circuit board 54 by the conveyance device 30 is 5 seconds. In such a case, when the circuit boards 54 are simultaneously conveyed in each of the two groups, it is necessary for the group of the four work machines 20e to 20h on the downstream side to stand by for 5 seconds that is the conveyance time of the circuit board 54. Meanwhile, when the circuit boards 54 are collectively and simultaneously conveyed in each of the eight work machines 20a to 20h, it is necessary for the group of the work machines 20e to 20h on the downstream side to standby for 4 seconds that is a difference of work time between the two groups. That is, in a case where the difference of work time between the two groups is longer than the conveyance time of the circuit board 54 by the conveyance device 30, it is not possible to achieve shortening of throughput even by performing simultaneous conveyance of the circuit boards 54 in each of the two groups. In consideration of such, in the board work system 10, in a case where the difference of work time of the two groups is shorter than the conveyance time of the circuit board 54 by the conveyance device 30, the circuit boards 54 in each of the two groups are simultaneously conveyed, and in a case where the difference of work time of the two groups is shorter than the conveyance time of the circuit board 54 by the conveyance device 30, the circuit boards 54 in the eight work machines 20a to 20h are collectively and simultaneously conveyed.

Note that, as shown in FIG. 5, the controller 102 of the control device 100 has a rotation control section 110 and a conveyance control section 112. The rotation control section 110 is a functional portion for causing the conveyor belt 50 to orbit to cause the protruding section 58 to move to a position at which it is possible to engage with the circuit board 54. The conveyance control section 112 is a functional portion for conveying the circuit board 54 in a state of engaging with the protruding section 58.

Incidentally, in the applied example, the board work system 10 is an example of a board work system. The work machine 20 is an example of a board work machine. The conveyance device 30 is an example of a conveyance device. The board holding device 40 is an example of a clamping device. The conveyor belt 50 is an example of a conveyor belt. The protruding section 58 is an example of a protruding section. The control device 100 is an example of a control device. The rotation control section 110 is an example of a rotation control section. The conveyance control section 112 is an example of a conveyance control section.

Note that, the present disclosure is not limited to the applied example described above, and it is possible to carry out the present disclosure in various aspects subjected to various modifications and improvements based on the knowledge of a person skilled in the art. Specifically, for example, in the applied example, the conveyor belt 50 rotates while the circuit board 54 is clamped, the end face on the opposite side to the conveyance direction of the circuit board 54 and the end face on the revolving direction side of the protruding section 58 match in the up-down direction, but the conveyor belt 50 may be rotated such that the protruding section 58 is positioned further on the upstream side than the end face on the opposite side to the conveyance direction of the circuit board 54. At this time, it is necessary for the protruding section 58 to be positioned further on the downstream side than the end face on the conveyance direction side of the circuit board that is newly brought into the work machine 20. In this manner, in a case where the protruding section 58 is moved, when the circuit board 54 is conveyed, the circuit board 54 and the protruding section 58 are not engaged. However, in a case where the circuit board 54 is not suitably conveyed for some reason, the circuit board 54 engages with the protruding section 58, and is pushed out toward the work machine 20 on the downstream side by the protruding section 58. Thereby, even in a case where the protruding section 58 is moved further to the downstream side than the end face on the opposite side to the conveyance direction of the circuit board 54, it is possible to exhibit the same effect as the applied example.

In addition, in the applied example, the shape of the protruding section 58 is a plate shape, but as long as it is possible to engage with the circuit board 54, it is possible to adopt various shapes for the protruding section 58. In addition, in the applied example, one protruding section 58 is formed on the conveyor belt 50, but it is possible to form multiple protruding sections 58.

In addition, in the applied example, calibration of the position of the projecting portion 58 is performed based on captured image data of the projecting portion 58, but it is possible to detect the projecting portion 58 using the detection sensor 68 and perform calibration of the position of the protruding section 58 using the detection value.

REFERENCE SIGNS LIST

10: board work system, 20: work device (board work machine), 30: conveyance device, 40: board holding device (clamping device), 50: conveyor belt, 58: protruding section, 100: control device, 110: rotation control section, 112: conveyance control section

The invention claimed is:

1. A board work machine comprising:
  a conveyance device having a conveyor belt on which a circuit board is placed and a clamping device that clamps the circuit board in a state in which the circuit board has been moved on the conveyor belt; and
  a control device that controls operation of the conveyance device,
  wherein a protruding section is formed on a placement face of the conveyor belt, and
  the control device includes a rotation control section that rotates the conveyor belt such that an end face of the protruding section on a revolving direction side of the protruding section matches, in an up-down direction, an upstream side of an end face on an opposite side to a conveyance direction of the circuit board while the circuit board is clamped by the clamping device.

2. The board work machine according to claim 1,
  wherein the rotation control section rotates the conveyor belt such that the protruding section is positioned on the upstream side of the end face on the opposite side to the conveyance direction of the circuit board in a case where the clamping device is released and on a downstream side of an end face on the conveyance direction side of a circuit board that is newly brought into the board work machine by the conveyance device.

3. The board work machine according to claim 1,
  wherein the control device includes a conveyance control section that conveys the circuit board in a state in which the protruding section is engaged with the end face on the opposite side to the conveyance direction of the circuit board after clamping of the circuit board is released.

4. A board work system comprising:
  a plurality of the board work machines according to claim 1 arranged in one row,
  the system executing work on a circuit board that is conveyed from the board work machine disposed on the upstream side of the plurality of board work machines to the board work machine disposed on the downstream side of the plurality of board work machines,
  wherein the control device has a conveyance control section that simultaneously conveys the circuit boards after the clamping of the circuit boards is released in two or more adjacent board work machines out of the plurality of board work machines.

* * * * *